United States Patent
Pydipaty et al.

(10) Patent No.: US 10,545,823 B2
(45) Date of Patent: Jan. 28, 2020

(54) ACCELERATING ERASURE CODE REPLICATION IN DISTRIBUTED SYSTEMS

(71) Applicant: Cisco Technology, Inc., San Jose, CA (US)

(72) Inventors: Ramdoot Kumar Pydipaty, Bangalore (IN); Amit Kumar Saha, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 176 days.

(21) Appl. No.: 15/783,281

(22) Filed: Oct. 13, 2017

(65) Prior Publication Data

US 2019/0114223 A1    Apr. 18, 2019

(51) Int. Cl.
| | |
|---|---|
| *G11C 29/00* | (2006.01) |
| *G06F 11/10* | (2006.01) |
| *G06F 3/06* | (2006.01) |
| *G11C 29/52* | (2006.01) |

(52) U.S. Cl.
CPC .......... *G06F 11/1068* (2013.01); *G06F 3/065* (2013.01); *G06F 3/067* (2013.01); *G06F 3/0619* (2013.01); *G06F 3/0688* (2013.01); *G11C 29/52* (2013.01)

(58) Field of Classification Search
CPC .... G06F 11/1068; G06F 3/0619; G06F 3/065; G06F 3/067; G06F 3/0688; G11C 29/52
See application file for complete search history.

(56) References Cited

U.S. PATENT DOCUMENTS

| | | | |
|---|---|---|---|
| 5,925,140 A | * | 7/1999 | Hudson ................... G06F 11/10 714/52 |
| 6,691,101 B2 | | 2/2004 | MacNicol et al. |
| 7,480,672 B2 | | 1/2009 | Hahn et al. |
| 8,086,755 B2 | | 12/2011 | Duffy, IV et al. |
| 8,713,405 B2 | | 4/2014 | Healey, Jr. et al. |
| 8,788,913 B1 | * | 7/2014 | Xin ...................... H03M 13/373 714/776 |
| 8,850,108 B1 | * | 9/2014 | Hayes ................. G06F 12/0246 711/103 |
| 8,990,335 B2 | | 3/2015 | Fauser et al. |
| 9,003,159 B2 | | 4/2015 | Deshkar et al. |
| 9,229,810 B2 | | 1/2016 | He et al. |

(Continued)

OTHER PUBLICATIONS

Astakhov et al., "Lambda Architecture for Batch and RealTime Processing on AWS with Spark Streaming and Spark SQL," Amazon Web Services (AWS), May 2015, pp. 1-12.

*Primary Examiner* — Christine T. Tu
(74) *Attorney, Agent, or Firm* — Polsinelli PC

(57) ABSTRACT

The present disclosure involves systems and methods for managing data in a distributed storage system. The distributed storage system may include non-volatile memory (NVM) storage devices and utilize erasure code replication for storage of data. A controller may first store at least some of the K data chunks in NVM devices before storing the coding chunks in other storage devices. In addition, the controller may transmit read requests to the NVM devices of the system first to begin receiving data chunks or coding chunks related to the data object. By writing to and reading from NVM devices first, storage and reading of the data object may occur faster than conventional storage systems.

18 Claims, 6 Drawing Sheets

(56) References Cited

U.S. PATENT DOCUMENTS

| | | |
|---|---|---|
| 9,244,761 B2 | 1/2016 | Yekhanin et al. |
| 9,244,776 B2 | 1/2016 | Koza et al. |
| 9,361,192 B2 | 6/2016 | Smith et al. |
| 9,374,270 B2 | 6/2016 | Nakil et al. |
| 9,479,556 B2 | 10/2016 | Voss et al. |
| 9,483,337 B2 | 11/2016 | Gladwin et al. |
| 9,558,078 B2 | 1/2017 | Farlee et al. |
| 9,613,078 B2 | 4/2017 | Vermeulen et al. |
| 2002/0103815 A1 | 8/2002 | Duvillier et al. |
| 2003/0174725 A1 | 9/2003 | Shankar |
| 2015/0142733 A1 | 5/2015 | Shadmon |
| 2015/0222444 A1 | 8/2015 | Sarkar |
| 2015/0302058 A1 | 10/2015 | Li et al. |
| 2016/0119159 A1 | 4/2016 | Zhao et al. |
| 2016/0335361 A1 | 11/2016 | Teodorescu et al. |
| 2017/0053132 A1 | 2/2017 | Resch |
| 2018/0032395 A1* | 2/2018 | Yang .................. G06F 11/1068 |

* cited by examiner

ACCELERATING ERASURE CODE REPLICATION IN DISTRIBUTED SYSTEMS

TECHNICAL FIELD

The present disclosure relates generally to the field of computing, and more specifically, to data management in distributed storage systems.

BACKGROUND

As computers become more commonplace in today's society, there is an ever increasing need for the storage of very large amounts of data and the fast access of such stored data. In some instances, companies manage huge amounts of data spread over many data centers on multiple continents. To house and manage this data, several types of large capacity storage nodes have thus been developed. Examples of high-capacity data storage systems involve physical devices (such as tape drives, optical storage systems, read only memory (ROM) systems, random access memory (RAM) systems, flash memory systems, and the like) that are grouped together physically or virtually over a network (such as in a storage area network (SAN) nodes or network attached storage (NAS) nodes). Virtual storage nodes are generally accessed remotely through a network to store and retrieve data utilized by executing applications.

In any storage system, there are often trade-offs between performance speed, storing capacity, and speed of retrieval of the data that is considered when instantiating the distributed storage system. In addition, storage networks may include thousands of storage devices or nodes that may frequently suffer hardware failures. Without proper storage precautions, such hardware failures may result in lost data. Thus, administrators of distributed storage networks often balance performance efficiency of the storage network against robustness of the system.

BRIEF DESCRIPTION OF THE DRAWINGS

The above-recited and other advantages and features of the disclosure will become apparent by reference to specific embodiments thereof which are illustrated in the appended drawings. Understanding that these drawings depict only example embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Figure 1:
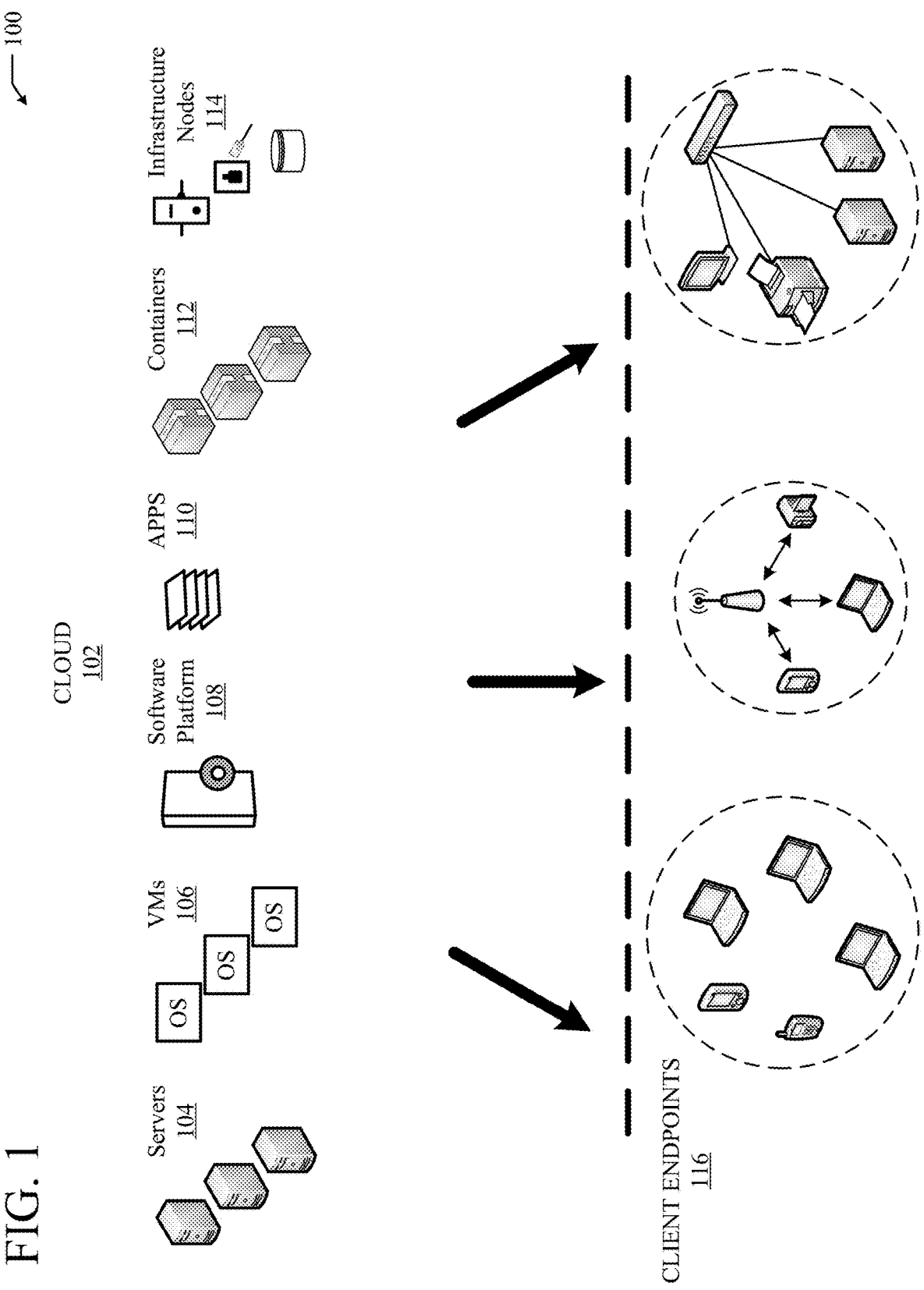
FIG. 1 is a system diagram of an example cloud computing architecture.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview:

A system, network device, method, and computer readable storage medium is disclosed for a controller of a distributed data storage system. In some embodiments, the controller may receive a storage type indicator from a plurality of storage devices of the distributed storage network, the storage type indicator comprising a non-volatile memory (NVM) storage device indicator or a non-NVM storage device indicator and a data object to store in the plurality of storage devices of the distributed storage network. The controller may further erasure code the data object into K data chunks and M coding chunks related to the data object, copy at least a subset of the K data chunks into a first subset of the plurality of storage devices of the distributed storage network, the first subset of the plurality of storage devices comprising storage types providing the NVM storage device indicator, and receive a storage success messages from each of the first subset of the plurality of storage devices. Also, the controller may store the M coding chunks in a second subset of the plurality of storage devices of the distributed storage network, the second subset of the plurality of storage devices comprising storage types providing the non-NVM storage device indicator, wherein storing the M coding chunks in the second subset of the plurality of storage devices occurs after copying the subset of the K data chunks into the first subset of the plurality of storage devices.

In addition, the controller may receive a request for the data object, issue a first plurality of read requests to the first subset of the plurality of storage devices for the stored at least subset of the K data chunks, and issue a second plurality of read requests to the second subset of the plurality of storage devices for the stored M coding chunks after the first plurality of read requests to the first subset of the plurality of storage devices is issued. Once K chunks of the data object are received, the controller may reconstruct the data object from any combination of K retrieved data chunks from the first subset of the plurality of storage devices and coding chunks from the second subset of the plurality of storage devices.

Example Embodiments

Aspects of the present disclosure involve systems and methods for managing data in a distributed storage system. In some instances, the distributed storage system discussed herein may include any number of storage devices in any number of disparately located data centers. In other instances, the storage system may be included in a single location. The storage system may include any number of storage devices or mediums, including both non-volatile memory (NVM) storage devices, such as non-volatile dual in-line memory modules (NVDIMMs). Such NVM devices are persistent storage devices that retain data during a power loss while storing or providing data at a speed similar to byte addressable storage devices. A read/write scheme may be provided within the storage system to favor the NVM storage devices to improve the operational speed of the system over conventional distributed storage systems.

In one particular embodiment, the storage system may utilize an erasure code replication scheme for storage of data to provide some protection against data loss. In general, the erasure code replication converts a data object for storing into K data chunks and M coding chunks. In instances where the storage system includes NVM devices, a controller may be configured to store at least some of the K data chunks in NVM devices before storing the remaining data chunks and M coding chunks in other storage devices of the system. This may operate to store the K data chunks faster than if non-NVM devices are utilized for persistent storage of data. When at least K chunks of the data object (either data chunks or coding chunks) have been stored, the controller may fulfill read requests for the data object.

Upon the receipt of a read operation, the controller may further be configured to transmit read requests to the NVM devices of the system first to begin receiving data chunks or coding chunks related to the data object. Read requests to the non-NVM devices for the remaining data chunks or coding chunks may then be issued to retrieve any remaining data object chunks to retrieve at least K chunks. By issuing read requests to NVM devices first, K number of data/coding chunks may be received at the controller such that the controller can reconstruct and provide the requested data object.

Beginning with the system of FIG. 1, a diagram of an example cloud computing architecture 100 is illustrated. The architecture can include a cloud computing environment 102 over which a storage network may be distributed. The cloud 102 may include one or more private clouds, public clouds, and/or hybrid clouds. Moreover, the cloud 102 may include any number and type of cloud elements 104-114, such as servers 104, virtual machines (VMs) 106, one or more software platforms 108, applications or services 110, software containers 112, and infrastructure nodes 114. The infrastructure nodes 114 can include various types of nodes, such as compute nodes, storage nodes, network nodes, management systems, etc.

The cloud 102 may provide various cloud computing services via the cloud elements 104-114 to one or more clients 116 of the cloud environment. For example, the cloud environment 102 may provide software as a service (SaaS) (e.g., collaboration services, email services, enterprise resource planning services, content services, communication services, etc.), infrastructure as a service (IaaS) (e.g., security services, networking services, systems management services, etc.), platform as a service (PaaS) (e.g., web services, streaming services, application development services, etc.), function as a service (FaaS), and other types of services such as desktop as a service (DaaS), information technology management as a service (ITaaS), managed software as a service (MSaaS), mobile backend as a service (MBaaS), etc.

Client endpoints 116 connect with the cloud 102 to obtain one or more specific services from the cloud 102. For example, the client endpoints 116 communicate with elements 104-114 via one or more public networks (e.g., Internet), private networks, and/or hybrid networks (e.g., virtual private network). The client endpoints 116 can include any device with networking capabilities, such as a laptop computer, a tablet computer, a server, a desktop computer, a smartphone, a network device (e.g., an access point, a router, a switch, etc.), a smart television, a smart car, a sensor, a GPS device, a game system, a smart wearable object (e.g., smartwatch, etc.), a consumer object (e.g., Internet refrigerator, smart lighting system, etc.), a city or transportation system (e.g., traffic control, toll collection system, etc.), an internet of things (IoT) device, a camera, a network printer, a transportation system (e.g., airplane, train, motorcycle, boat, etc.), or any smart or connected object (e.g., smart home, smart building, smart retail, smart glasses, etc.), and so forth.

Figure 2:
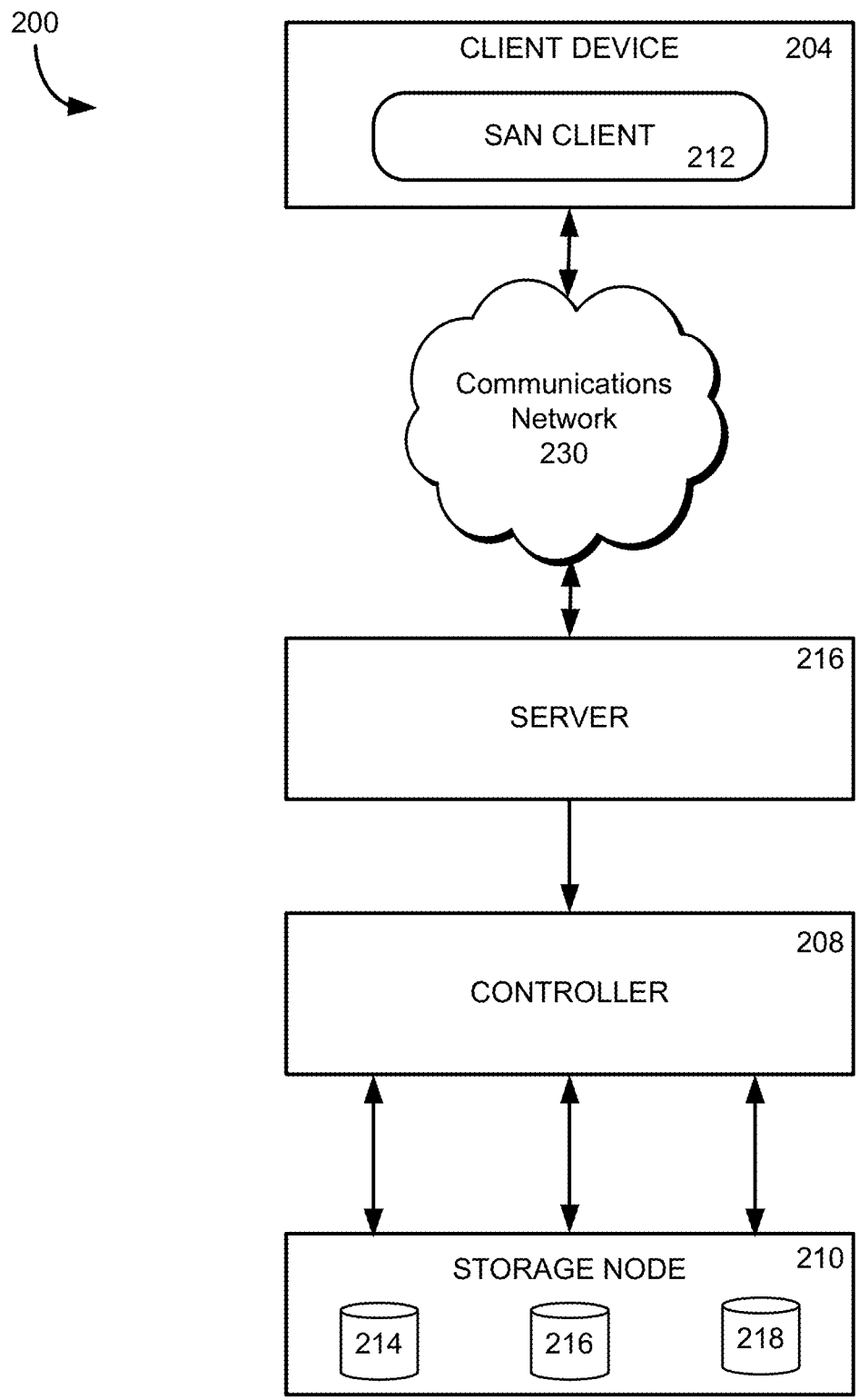
FIG. 2 is a system diagram for a distributed storage system.

As mentioned, the cloud environment 100 of FIG. 1 may be utilized, in some instances, to store data related to the operation of the cloud, an application executed on the cloud, or as part of network of communicating devices. FIG. 2 illustrates a generic computing architecture 200 for implementing such a distributed storage network. As illustrated, the computing architecture 200 includes a client device 204, such as the client endpoints discussed above, that may be used to execute and/or implement an SAN client 212 application. Through the SAN client 212, a system call (such as a read request or write command) is made over communication network 230, which may be an IP-based telecommunications network, the Internet, an intranet, a local area network, a wireless local network, a content distribution network, or any other type of communications network, as well as combinations of networks.

The system calls are transmitted to an application server 216 or any other networking device of the cloud environment 200. The server 216, in turn, may interface with a master node or SAN controller 208 which may include and/or define applications, processes, instructions, and/or other functions that may be used to store, retrieve, update, and/or manage data of the SAN, including storage node 210. The storage node 210 may include any number and type of storage device, such as disks 214, 216, and 218, on which data may be stored and from which the stored data may be retrieved. In this manner, client device 204 provides a system call to the storage node 210 (through the network 230, server 216, and controller 208) to manage the data of the storage node 210.

It should be appreciated that the storage node 210 illustrated in FIG. 2 may be a virtual storage node and may include any number of storage discs 214-218 or other storage media. For example, many storage devices in addition to the storage node 210 may be included in the storage network such that data may be spread across storage nodes, data centers, and/or geographical locations. For example and as explained in more detail below, a block of data (sometimes referred to as a "data object" or "object") may be stored across several storage devices of the SAN. The storage devices may be of different storage device type and may be located in different data centers or in varied locations. Management of the data storage within the SAN may be performed by the controller 208 of the system 200. Further, a distributed application (rather than the client device 204) may provide the system calls to the server 216 for retrieval or storage of data utilized by the application, in some instances. In this manner, varied data centers or storage devices may be utilized by any number of devices or applications associated with a cloud computing environment to store and otherwise manage data.

As discussed above, hardware failures in one or more storage devices or other components of a SAN may result in lost data. In particular, data that is stored in a storage device that loses power may be lost. Many methods have been developed to provide a level of protection to stored data in a SAN. For examples, some systems may incorporate replication of data that includes storage of replicated versions of data on different devices of the SAN so that, if one device is lost, the data is retrievable from a back-up device storing a replicated version of the data. Such systems may include any number of replications of the data stored on any number of storage devices. In another approach, a redundant array of independent disks (RAID) may be utilized that combines multiple disk drives into a single logical unit across which redundant data may be stored. By spreading the redundant data across the multiple disk drives, the potential loss of data is reduced. Each of the various data protection schemes provides some level of data protection at the expense of disc space and SAN performance.

Still another approach for providing protection against the loss of stored data may be referred to as erasure coding replication. In general, erasure coding replication transforms a data object into a first number of data chunks and a second number of coding chunks, oftentimes referred to as K data chunks and M coding chunks. The entire data object can then be generated from any K number of the object chunks of the erasure code. Thus, if a subset of the data chunks or a subset of the coding chunks is lost due to drive failure (or any other reason), any combination of K number of data chunks and coding chunks can be utilized to rebuild or construct the data object.

Figure 3:
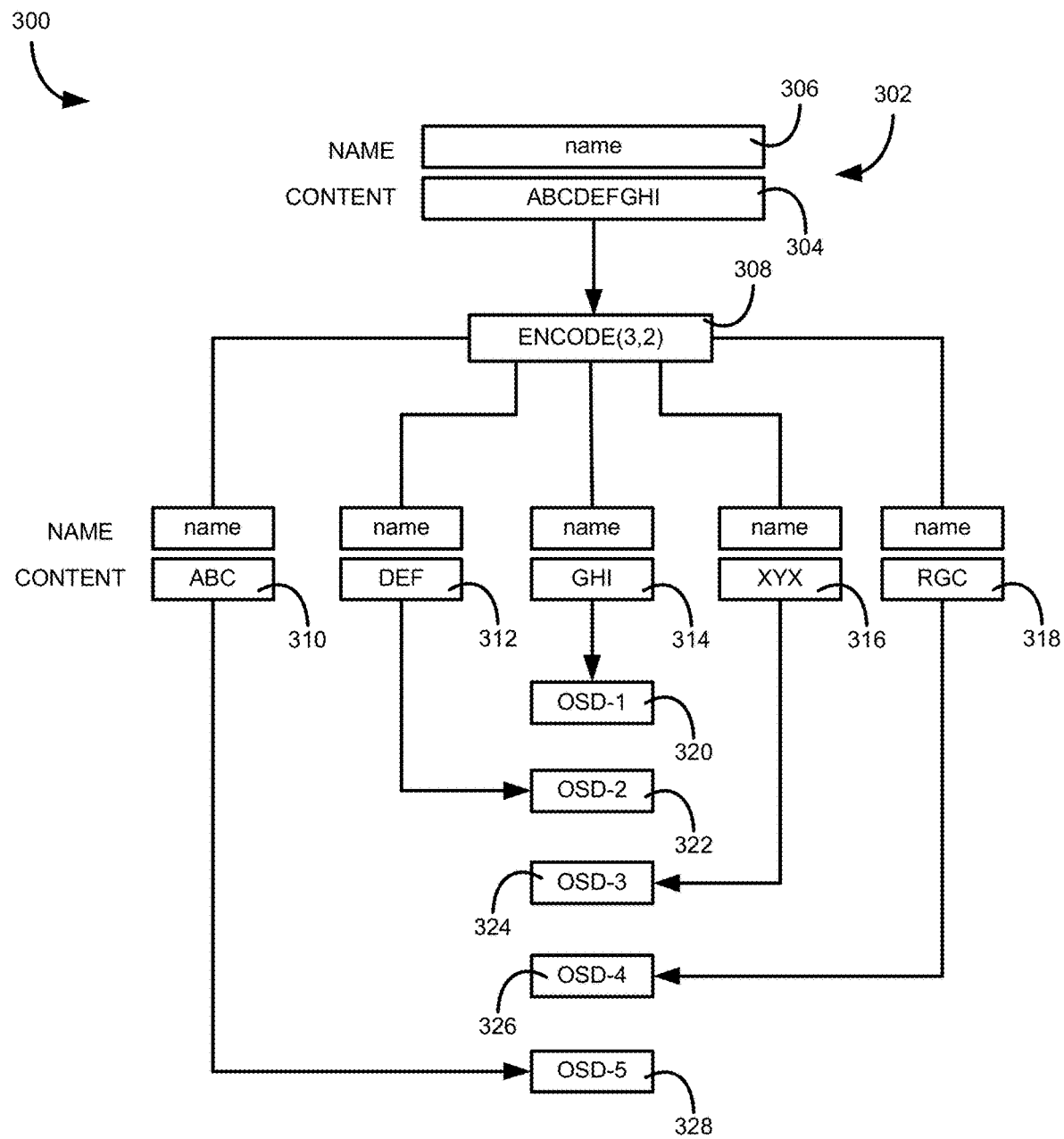
FIG. 3 is a diagram illustrating erasure coding replication of a data object.

FIG. 3 is a diagram 300 illustrating erasure coding replication of a data object 302. In some instances, the controller 208 of the SAN 200 discussed above performs the coding and storing of the data object 302 across any number of storage devices 320-328. The storage devices 320-328 are referred to herein as object storage devices (OSDs), although any type of storage device may be included to store chunks of the data object 302. As described above, a data object 302 for storing in the SAN may be received at the controller 208. As shown in the diagram 300, the data object 302 may include a name 306 (illustrated as "name") and content 304 (illustrated as "ABCDEFGHI"). It should be appreciated that the data object 302 may not include a name and may have any type of content, including binary bits, alphanumeric characters, machine code, etc. The name 306 and content 304 are provided in the diagram 300 for illustrative purposes only.

Upon receiving the data object 302, the controller 208 may encode the object into any number of data chunks and coding chunks. In the particular example illustrated, the controller 208 utilizes a (3, 2) coding scheme, although any known or hereafter developed ratio erasure coding scheme may be utilized. The (3, 2) coding scheme results in the controller 208 dividing the data object into three data chunks and calculating two code chunks. As described above, any combination of three data chunks or coding chunks may be utilized by the controller 208 to generate the data object 302. For example, if two data chunks 310, 312 are lost, the data object 302 may be recreated from data chunk 314 and the two coding chunks 316, 318.

More particularly, controller 208 creates first data chunk 310 that includes the name of the data object and a first portion ("ABC") of the data object content. A second data chunk 312 is also created that includes the name of the data object and a second portion ("DEF") of the data object content and a third data chunk 314 that includes the name of the data object and a third portion ("GHI") of the data object content. In addition, the controller 208 creates a first coding chunk 316 that includes the name of the data object and a first calculated code ("XYX") and a second coding chunk 318 that includes the name of the data object and a second calculated code ("RGC"). As illustrated, the coding chunks 316, 318 may or may not include portions of the content 304 of the data object. Rather, the coding chunks are calculated to provide a scheme to rebuild the data object content 304 if portions of the data chunks 310-314 and coding chunks 316, 318 are lost.

Also illustrated in FIG. 3 are several OSDs 320-328 of the SAN, OSD-1 through OSD-5. The controller 208 may store each of the data chunks 310-314 and coding chunks 316, 318 in separate OSDs of the SAN. For example, data chunk 310 may be stored in OSD-5 328, data chunk 312 may be stored in OSD-2 322, data chunk 314 may be stored in OSD-1 320, coding chunk 316 may be stored in OSD-3 324, and coding chunk 318 may be stored in OSD-4 326. The storage of the data chunks 310-314 and coding chunks 316, 318 in separate OSDs of the SAN may be done to prevent more than a few losses of the chunks due to a power loss or other data compromise. Thus, if OSD-1 310 and OSD-2 312 were to fail, the controller 208 may access OSD-3 through OSD-5 to obtain data chunk 314 and coding chunks 316, 318 to create the data object 302. In other words, even if there is a failure at any two of the OSDs 320-328, the controller 208 may obtain and provide the data object 302 to a requesting device or application.

Regardless of lost data, the controller 208 may respond to received read requests for the data object 302 by transmitting requests to each OSD 320-328 for the stored chunk under the data object name 306. Each OSD 320-328 may return the corresponding data chunk 310-314 or coding chunk 316, 318 to the controller 208. Once the controller 208 receives K number of either data chunk 310-314 or coding chunk 316, 318, the controller can create the data object 302 and transmit the object to the requesting device. In this particular example, K equals three such that receiving any three data chunk 310-314 or coding chunk 316, 318 may cause the controller 208 create the data object 302 and transmit the object in response to the read request.

In general, it is more cost effective for an SAN to utilize erasure coding replication than compared to the regular (1, N) replication as less data is required to be stored. However, erasure coded schemes are also usually considered slow in distributed storage systems because of the computational complexity involved in creating chunks of data and distributing the chunks of data to various nodes. Unless K nodes successfully write/read chunks of the data object, the operation is incomplete and the system waits until at least K chunks are stored. Adding to the performance issue of erasure coding replication in an SAN is the use of persistent storage devices for storing the data chunks and coding chunks of the object. Persistent storage devices, such as hard disk drives (HDD) or solid-state drives (SSD) provide protection in the case of a loss of power, but writing to and reading from persistent storage media is typically slower than writing to or reading from byte addressable storage media, such as RAM or ROM storage devices.

Thus, the faster the nodes of an SAN complete the read/write operation, the better the performance of the SAN. To address this, the SAN may incorporate any number of non-volatile memory (NVM) devices, such as non-volatile dual in-line memory modules (NVDIMMs). NVM storage devices are persistent memory systems that retain data even when electrical power is removed (either from an unexpected power loss, system crash, or normal shutdown). Further, read/write operations on NVMs may occur faster than other types of persistent storage devices, improving the overall performance of the SAN.

Figure 4:
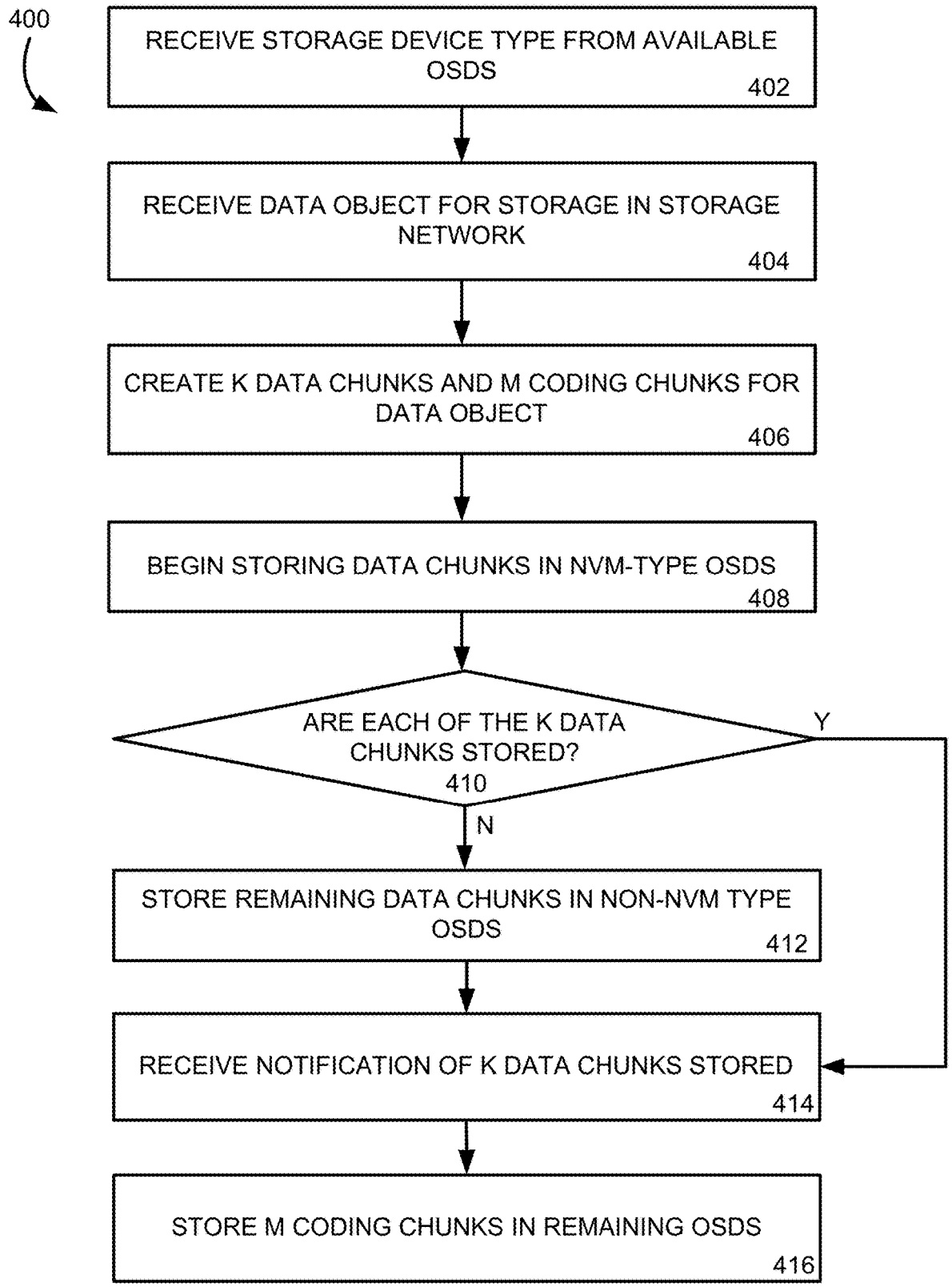
FIG. 4 is a flowchart of a method for writing a data object in a distributed storage system including non-volatile memory storage.

FIG. 4 is a flowchart of a method 400 for writing a data object in a distributed storage system that includes NVM storage devices. In general, the operations of the method 400 are performed by the controller 208 of the SAN discussed above, although any component of the SAN or related to the SAN may perform one or more of the described operations. Through the method 400, the controller 208 may perform erasure coding replication on a data object to be stored in the distributed storage system in a faster and more efficient manner than in other distributed storage systems.

Beginning in operation 402, the controller 208 receives performance or type indicators of the available OSDs of the storage system 300. In particular, the controller 208 receives an indication of which OSDs of the system 300 are NVM type memory devices and which OSDs are non-NVM type memory devices. In some embodiments, the controller 208 may store or otherwise maintain a listing of the OSDs of the storage system 300 that are NVM type memory devices for use during storing of data objects.

In operation 404, the controller 208 receives a data object 302 to be stored in the storage system. As mentioned above, the data object 302 may accompany a write request received at the controller 208 to instruct the controller to store the data object. The data object 302 may be received from a computing device (such as a client device) or from an application utilizing the storage system. Upon receipt, the controller 208 divides the content 304 of the data object 302 into K number of data chunks in operation 406. The number of data chunks may vary based on the type of erasure coding scheme utilized by the controller. In addition, the controller 208 may calculate an M number of coding chunks related to the content 304 of the data object 302. As explained above, the coding chunks may be utilized by the controller 208 to rebuild or create the content of the data object 302 should one or more data chunks be lost.

In operation 408, the controller 208 issues write requests to one or more NVM type storage devices of the storage network to store at least a portion of the K data chunks of the data object 302. For example, the controller 208 may access or otherwise determine a list of NVM type storage devices of the storage network. The number of NVM devices of the storage network may be more than, equal to, or less than K. Thus, the controller 208 may begin storing the data chunks of the data object 302 into those storage devices (OSDs) that are identified as NVM type storage devices. In the circumstance where the storage system includes more than (or equal to) K NVM storage devices, each of the K data chunks may be stored in the NVM devices. In particular, the controller 208 issues write requests to K NVM OSDs of the storage network, with each write request to store one of the data chunks of the data object 302 in a corresponding NVM OSD.

In the circumstance where the storage network includes less than K NVM OSDs, the controller 208 may begin storing data chunks into the NVM devices. Because there are fewer NVM OSDs of the storage network than the number of data chunks of the data object 302, only a subset of K data chunks may be stored in the NVM devices. As such, in operation 410 the controller 208 determines if each of the K data chunks of the data object 302 is stored in the OSDs of the storage network. If not all of the K data chunks are stored in OSDs of the storage network, the controller 208 issues write requests to non-NVM OSDs of the storage network to store the remaining data chunks in operation 412.

If all of the K data chunks are stored in NVM OSDs or a combination of NVM OSDs and non-NVM OSDs, the controller 208 receives a notification that all K data chunks have been stored. In particular, each OSD may return a complete or success message to the controller 208 upon the storage of the data chunk in the respective OSD. Thus, the controller 208 may receive K success messages from the K number of OSDs of the storage network to determine that all K data chunks have been stored. After storage of the K data chunks, the controller 208 may fulfill read requests received from client devices of applications if there is no loss of data on the K OSDs of the storage network. Responding to read requests the controller 208 of the system is described in more detail below with reference to FIG. 5.

In operation 416, the controller 208 issues one or more write requests to one or more of the OSDs of the storage network to store the M coding chunks related to the data object 302. The M coding chunks may be stored in any OSD of the system, including the NVM OSDs, the non-NVM OSDs, OSDs that include a data chunk of the data object 302, and the like. In general, however, the M coding chunks are stored on M OSDs of the storage network that are different than the K OSDs that include the data chunks of the data object 302. Further, the storage of the M coding chunks may occur in the background of the controller 208 as only the K data chunks are needed to rebuild or provide the data object 302 to a requesting device 302. In other words, the controller 208 may return the data object 302 to a requesting device or application once the K data chunks are stored. Storage of the M coding chunks may occur at a later time and operate as protection against the loss of one or more of the K data chunks.

Through the method 400 of FIG. 4, the controller 208 leverages the NVM OSDs in the storage network to store as many of the K data chunks as possible. Because the NVM OSDs can be written to faster than other persistent memory devices (or non-NVM devices), the writing of the data object to storage in the preferred NVM OSDs occurs faster than other storage systems. Also, because the writing to the NVM OSDs occurs faster than other storage devices, the data object 302 is also available for retrieval (or in response to a read request) faster. Thus, the erasure coding replication of the distributed storage system is accelerated through the use of the NVM OSDs of the storage system.

Figure 5:
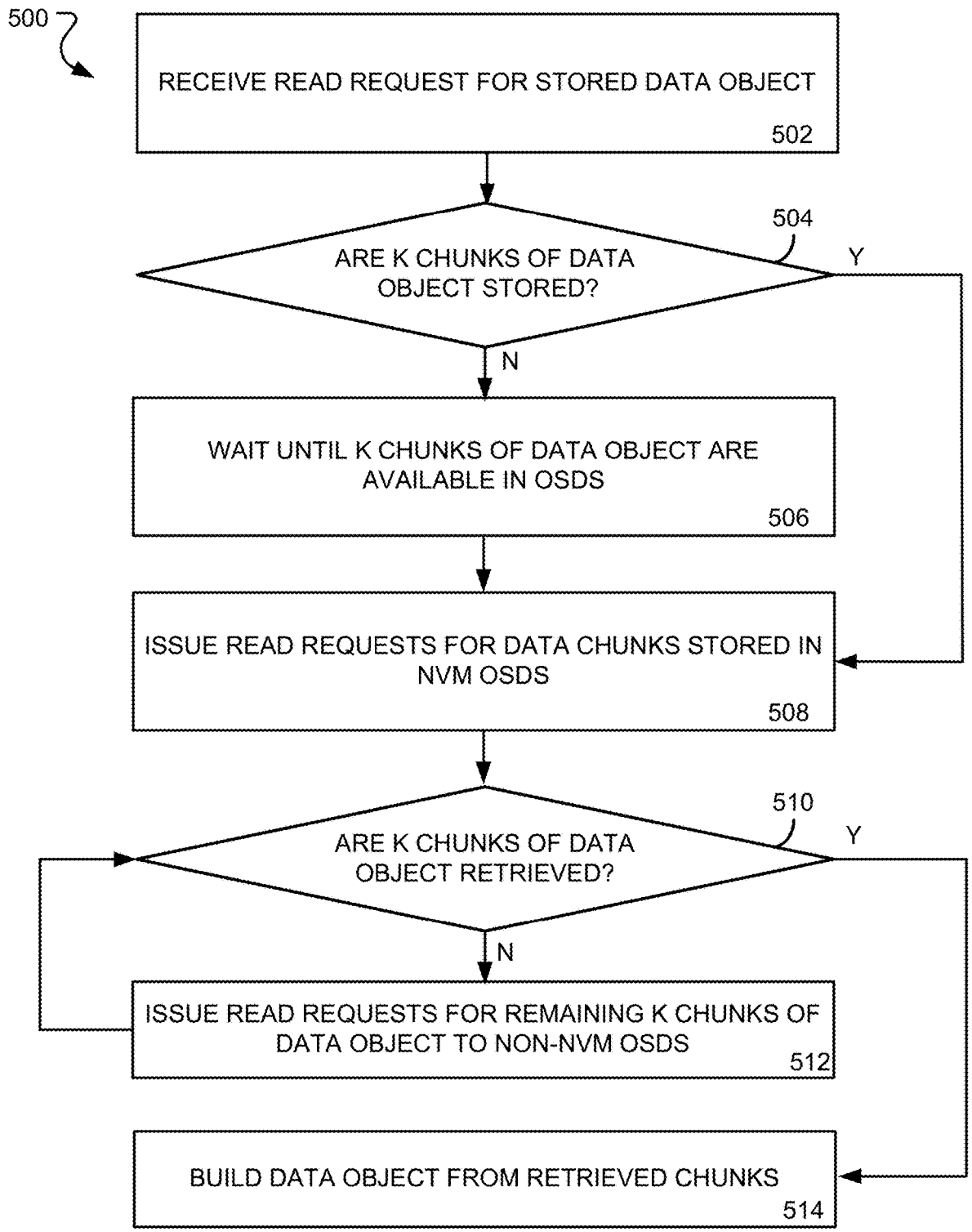
FIG. 5 is a flowchart of a method for reading a data object in a distributed storage system including non-volatile memory storage.

FIG. 5 is a flowchart of a method 500 for reading a data object in a distributed storage system including non-volatile memory storage. Similar to above, the operations of the method 500 of FIG. 5 may be performed by the controller 208 of the SAN discussed above, although any component of the SAN or related to the SAN may perform one or more of the described operations. Through the method 500, the controller 208 may retrieval of erasure coding replication data objects from the distributed storage system in a faster and more efficient manner than in other distributed storage systems.

Beginning in operation 502, the controller 208 may receive a read request for a data object stored or maintained by the storage system. The read request may be received from a client device or executing application of the distributed storage system. In response to the read request, the controller 208 may determine if at least K chunks (either data chunks or coding chunks) are stored and available from the storage devices of the storage system in operation 504. In general, each OSD or other storage device of the storage system may return a complete or success message to the controller 208 upon the storage of the data chunk or coding chunk of a data object in the respective OSD. The controller 208 may track or store the received successful storage instructions from the OSDs of the storage system to determine if K chunks of the data object 302 have been stored in any number of OSDs of the system.

If the controller 208 determines that K chunks have not been stored in the OSDs of the system, the controller may wait until K success messages are received in operation 506. If the controller 208 determines that K chunks (either data or coding chunks) associated with the requested data object are stored or waits until K chunks have been stored, the controller may issue read requests to one or more NVM OSDs to retrieve at least a portion of the data chunks of the data object 302 in operation 508. For example, at least one data chunk of the data object 302 may be stored in an NVM OSD of the system. The controller 208 may thus identify the NVM OSDs of the system that have stored a chunk (either data chunk or coding chunk) of the data object 302. Once identified, the controller 208 may issue read requests for those chunks stored in NVM OSDs first to begin retrieving the chunks for providing the data object 302 to the requesting device or application. In some instances, only a subset of K chunks needed to recreate the data object 302 may be stored in NVM OSDs such that requesting chunks from the NVM OSDs provides a partial solution to the controller for the requested data object. In other instances, all of the K data chunks are stored in NVM OSDs of the system such that the controller 208 receives all K data chunks from NVM OSDs.

In operation 510, the controller 208 determines if K chunks related to the data object 302 have been retrieved from the OSDs of the system. As mentioned above, the controller 208 may first request data and/or coding chunks of the data object 302 from NVM OSDs of the system. The NVM OSDs may or may not include K chunks of the data object 302. If K chunks have not been requested, the controller 208 may issue read requests for additional data chunks or coding chunks of the data object 302 from non-NVM OSDs in operation 512. The non-NVM OSDs may include data chunks or coding chunks and the controller 208 may issue read requests for all or some of the remaining chunks.

Upon requesting the remaining chunks of the data object 302 from the non-NVM OSDs, the controller 208 may return to operation 510 to determine if K chunks related to the data object 302 have been received from the OSDs. Once K chunks (either data chunks or coding chunks) have been retrieved from the OSDs, the controller 208 may build the requested data object from the K retrieved chunks in operation 514 and provide the data object to the requested client device or application. As described above, the controller 208 may create the data object 302 from any combination of K data chunks and/or coding chunks such that the once K chunks have been retrieved from the OSDs, the controller may provide the data object to the requesting device, without waiting for all of the data chunks and coding chunks to be retrieved. In other words, the controller 208 may provide the data object 302 to the requesting device or application upon receiving any K number of chunks of the object.

Because the controller 208 issues read requests for the chunks of the data object 302 to NVM OSDs first, retrieval or reconstructing of the data object 302 may occur faster than in other distributed storage systems. In particular, NVM storage devices retrieve data faster than other persistent memory devices (or non-NVM devices). Thus, by issuing read requests from NVM OSDs first, K chunks of the data object (whether data chunks or coding chunks) may be retrieved quickly from the NVM OSDs. This may improve the speed for retrieving a data object from storage of the distributed storage system by leveraging the NVM OSDs of the storage system first in retrieving chunks related to the requested data object 302 to achieve a faster storage and retrieval (read and write).

By first storing data chunks to identified NVM OSDs (or other storage devices) of the storage system before storing additional data chunks and coding chunks to non-NVM OSDs and issuing read requests to NVM OSDs before issuing read requests to non-NVM OSDs, the controller 208 may perform received read and write instructions faster than other storage systems. In particular, the controller 208 may leverage the NVM OSDs to store and retrieve K data chunks such that the data object is stored faster and available for retrieval faster than systems that utilize non-NVM persistent storage devices. Further, the system may provide the data object 302 to a requesting device or application once K data or coding chunks are received without waiting for all data and/or coding chunks to be retrieved. In this manner, the system may accelerate the writing and reading of the data object 302 in comparison to other distributed storage systems.

Figure 6:
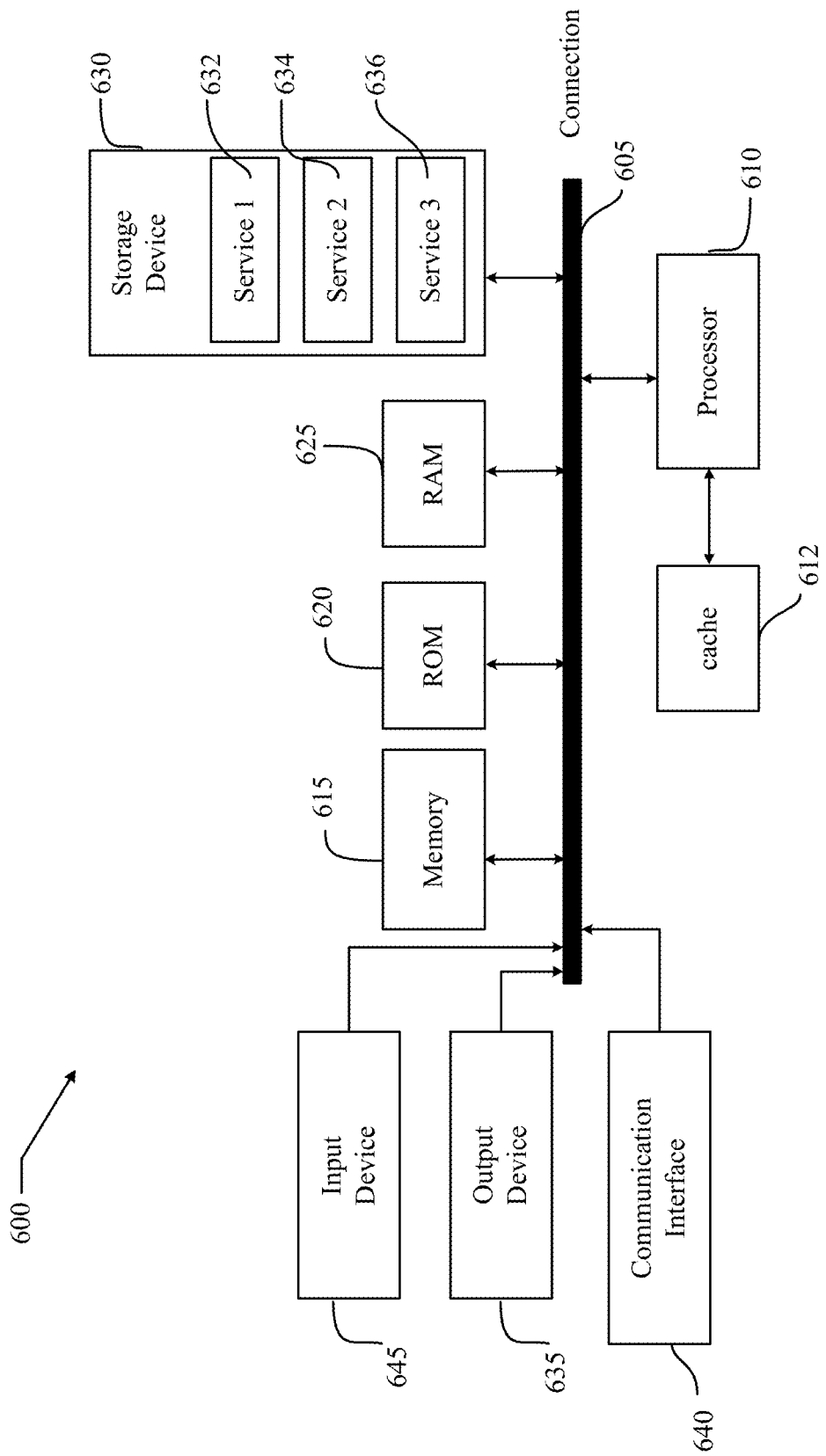
FIG. 6 shows an example system embodiment.

FIG. 6 shows an example of computing system 600 which may be utilized in conjunction with the herein described systems and methods. In particular, the computing system 600 is an example of the controller 208 of the storage system described above. In the embodiment shown, the components of the system are in communication with each other using connection 605. In general, connection 605 can be a physical connection via a bus, or a direct connection into processor 610, such as in a chipset architecture. Connection 605 can also be a virtual connection, networked connection, or logical connection.

In some embodiments, computing system 600 is a distributed system in which the functions described in this disclosure can be distributed within a datacenter, multiple datacenters, a peer network, etc. In some embodiments, one or more of the described system components represents many such components, each performing some or all of the function for which the component is described. In some embodiments, the components can be physical or virtual devices.

Example system 600 includes at least one processing unit (CPU or processor) 610 and connection 605 that couples various system components, including system memory 615, such as read only memory (ROM) 620 and random access memory (RAM) 625, to processor 610. Computing system 600 can include a cache of high-speed memory connected directly with, in close proximity to, or integrated as part of processor 610.

Processor 610 can include any general purpose processor and a hardware service or software service, such as services 632, 634, and 636 stored in storage device 630, configured to control processor 610 as well as a special-purpose processor where software instructions are incorporated into the actual processor design. Processor 610 may essentially be a completely self-contained computing system, containing multiple cores or processors, a bus, memory controller, cache, etc. A multi-core processor may be symmetric or asymmetric.

To enable user interaction, computing system 600 includes an input device 645, which can represent any number of input mechanisms, such as a microphone for speech, a touch-sensitive screen for gesture or graphical input, keyboard, mouse, motion input, speech, etc. Computing system 600 can also include output device 635, which can be one or more of a number of output mechanisms known to those of skill in the art. In some instances, multimodal systems can enable a user to provide multiple types of input/output to communicate with computing system 600. Computing system 600 can include communications interface 640, which can generally govern and manage the user input and system output. There is no restriction on operating on any particular hardware arrangement and therefore the basic features here may easily be substituted for improved hardware or firmware arrangements as they are developed.

Storage device 630 can be a non-volatile memory device and can be a hard disk or other types of computer readable media which can store data that are accessible by a computer, such as magnetic cassettes, flash memory cards, solid state memory devices, digital versatile disks, cartridges, random access memories (RAMs), read only memory (ROM), and/or some combination of these devices.

The storage device 630 can include software services, servers, services, etc., that when the code that defines such software is executed by the processor 610, it causes the system to perform a function. In some embodiments, a hardware service that performs a particular function can include the software component stored in a computer-readable medium in connection with the necessary hardware components, such as processor 610, connection 605, output device 635, etc., to carry out the function.

For clarity of explanation, in some instances the present technology may be presented as including individual functional blocks including functional blocks comprising devices, device components, steps or routines in a method embodied in software, or combinations of hardware and software.

Any of the steps, operations, functions, or processes described herein may be performed or implemented by a combination of hardware and software services or services, alone or in combination with other devices. In some embodiments, a service can be software that resides in memory of a portable device and/or one or more servers of a content management system and perform one or more functions when a processor executes the software associated with the service. In some embodiments, a service is a program, or a collection of programs that carry out a specific function. In some embodiments, a service can be considered a server. The memory can be a non-transitory computer-readable medium.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, solid state memory devices, flash memory, USB devices provided with non-volatile memory, networked storage devices, and so on.

Devices implementing methods according to these disclosures can comprise hardware, firmware and/or software, and can take any of a variety of form factors. Typical examples of such form factors include servers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

The invention claimed is:

1. A distributed data storage system comprising:
 a plurality of non-volatile memory (NVM) storage devices;
 a plurality of non-NVM storage devices; and
 a controller device that performs operations comprising:
  receives a data object to store in the distributed data storage system;
  erasure codes the data object into K data chunks and M coding chunks related to the data object;
  first stores at least a subset of the K data chunks into the plurality of NVM storage devices;
  determine whether the first stores resulted in all of the K data chunks being stored in the NVM storage devices;
  second stores, in response to the first stores not storing all of the K data chunks in the plurality of NVM storage devices, an un-stored remainder of the K data chunks in the plurality of non-NVM storage devices; and
  third stores the M coding chunks in the plurality of non-NVM storage devices, wherein storing the M coding chunks in the plurality of non-NVM storage devices occurs after successful completion of the first and second stores;
  wherein K and M are integers.

2. The distributed data storage system of claim 1 wherein each of the K data chunks of the data object comprises a portion of a content field of the data object.

3. The distributed data storage system of claim 2 wherein each of the M coding chunks of the data object comprises a calculated replication value of the content field of the data object, the calculated replication value configured to reconstruct the content field of the data object from K data chunks.

4. The distributed data storage system of claim 1, the operations further comprising:
 receiving a request for the data object;
 first issuing a first plurality of read requests for the stored at least a first subset of the K data chunks; and
 second issuing, after the first issuing, a second plurality of read requests for the stored M coding chunks.

5. The distributed data storage system of claim 4, the operations further comprising reconstructing the data object from any combination of the K data chunks from the plurality of NVM storage devices and M coding chunks from the plurality of non-NVM storage devices.

6. The distributed data storage system of claim 1 wherein the plurality of NVM storage devices each comprises a byte addressable non-volatile dual in-line memory module storage device.

7. A method for managing a distributed data storage system, comprising:
receiving a data object to store in the distributed data storage system;
erasure coding the data object into K data chunks and M coding chunks related to the data object;
first storing at least a subset of the K data chunks into a plurality of NVM storage devices;
determining whether the first storing resulted in all of the K data chunks being stored in the NVM storage devices;
second storing, in response to the first stores not storing all of the K data chunks in the plurality of NVM storage devices, an un-stored remainder of the K data chunks in a plurality of non-NVM storage devices; and
third storing the M coding chunks in the plurality of non-NVM storage devices, wherein storing the M coding chunks in the plurality of non-NVM storage devices occurs after successful completion of the first and second storing;
wherein K and M are integers.

8. The method of claim 7 wherein each of the K data chunks of the data object comprises a portion of a content field of the data object.

9. The method of claim 8 wherein each of the M coding chunks of the data object comprises a calculated replication value of the content field of the data object, the calculated replication value configured to reconstruct the content field of the data object from K data chunks.

10. The method of claim 7 further comprising:
receiving a request for the data object;
first issuing a first plurality of read requests for the K data chunks; and
second issuing, after the first issuing, a second plurality of read requests for the stored M coding chunks.

11. The method of claim 10 further comprising reconstructing the data object from any combination of the K data chunks from the plurality of NVM storage devices and M coding chunks from the plurality of non-NVM storage devices.

12. The method of claim 7 wherein the plurality of NVM storage devices each comprises a byte addressable non-volatile dual in-line memory module storage device.

13. A non-transitory computer readable media storing instructions which when executed cause a distributed data storage system to perform operations comprising:
receiving a data object to store in the distributed data storage system;
erasure coding the data object into K data chunks and M coding chunks related to the data object;
first storing at least a subset of the K data chunks into a plurality of NVM storage devices;
determining whether the first storing resulted in all of the K data chunks being stored in the NVM storage devices;
second storing, in response to the first stores not storing all of the K data chunks in the plurality of NVM storage devices, an un-stored remainder of the K data chunks in a plurality of non-NVM storage devices; and
third storing the M coding chunks in the plurality of non-NVM storage devices, wherein storing the M coding chunks in the plurality of non-NVM storage devices occurs after successful completion of the first and second storing;
wherein K and M are integers.

14. The non-transitory computer readable media of claim 13 wherein each of the K data chunks of the data object comprises a portion non-transitory computer readable media of a content field of the data object.

15. The non-transitory computer readable media of claim 14 wherein each of the M coding chunks of the data object comprises a calculated replication value of the content field of the data object, the calculated replication value configured to reconstruct the content field of the data object from K data chunks.

16. The non-transitory computer readable media of claim 13, the operations further comprising:
receiving a request for the data object;
first issuing a first plurality of read requests for the stored at least a first subset of the K data chunks; and
second issuing, after the first issuing, a second plurality of read requests for the stored M coding chunks.

17. The non-transitory computer readable media of claim 16, the operations further comprising reconstructing the data object from any combination of the K data chunks from the plurality of NVM storage devices and M coding chunks from the plurality of non-NVM storage devices.

18. The non-transitory computer readable media of claim 13 wherein the plurality of NVM storage devices each comprises a byte addressable non-volatile dual in-line memory module storage device.

* * * * *